United States Patent [19]

Genuit

[11] 4,082,961
[45] Apr. 4, 1978

[54] LIGHT SWITCH WITH DELAYED TURNOFF

[76] Inventor: Luther L. Genuit, 6231 Calle Del Paisano, Phoenix, Ariz. 85251

[21] Appl. No.: 627,898

[22] Filed: Nov. 3, 1975

[51] Int. Cl.² .................. H01H 7/00; H01H 43/00
[52] U.S. Cl. ............................. 307/141; 315/194; 315/360
[58] Field of Search ............ 315/360, 362, 82, 84, 315/194; 307/141, 141.4; 317/141 S; 361/197, 198

[56] References Cited

U.S. PATENT DOCUMENTS

| | | | |
|---|---|---|---|
| 3,221,211 | 11/1965 | Murphy et al. | 315/84 |
| 3,558,996 | 1/1971 | Mitchell et al. | 318/141 S |
| 3,641,397 | 2/1972 | Elliot et al. | 361/198 |
| 3,680,539 | 8/1972 | Savage et al. | 361/197 |
| 3,764,832 | 10/1973 | Stettner | 361/198 |
| 3,790,848 | 2/1974 | Lai | 315/360 |

*Primary Examiner*—Robert K. Schaefer
*Assistant Examiner*—Eugene S. Indyk
*Attorney, Agent, or Firm*—Warren F. B. Lindsley

[57] ABSTRACT

An improved switch for controlling electrical circuits comprising a conventional mechanical on/off switch employing a solid state electronic network connected in parallel therewith for providing a current path for a limited period of time following the opening of the mechanical switch thereby producing a delay in the de-energization of the circuit.

18 Claims, 9 Drawing Figures

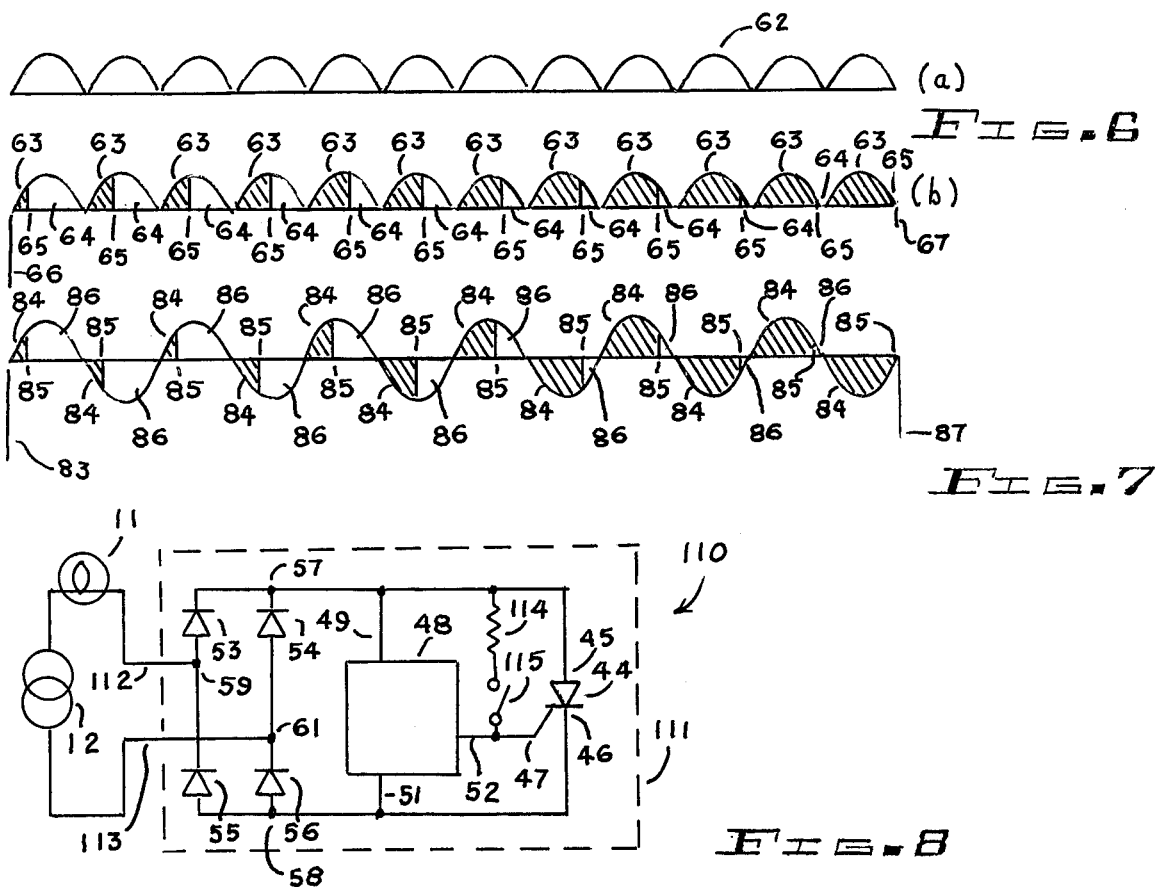
FIG. 6
FIG. 7
FIG. 8
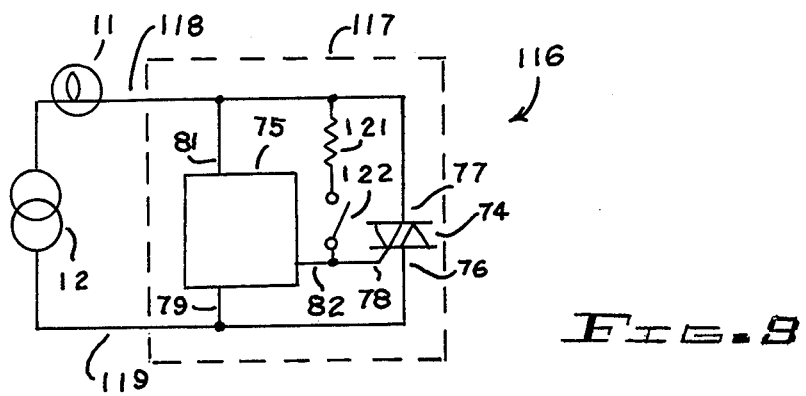
FIG. 9

LIGHT SWITCH WITH DELAYED TURNOFF

BACKGROUND OF THE INVENTION

Since the advent of artificial lighting man has been vexed by the problem of having to find his way to bed in the dark after turning out the light. Frequently he finds himself stumbling over or bumping into objects on the way and this poses a real hazard, especially for older people who might fall or incur serious bodily injury.

The same problem is experienced in a garage or carport when the light is turned off before getting into the car.

The problem is aggravated by the appreciably long period of time required for the eyes to adjust to the dark after having become accustomed to a lighted room.

A real need exists for a means for continuing the energization of a light for a period of time following the turning-off of a light switch circuit.

DESCRIPTION OF THE PRIOR ART

There is presently no commercially available device which offers a solution to the problems described. Mechanical timers have been employed in hotels and other places to enable the user to energize a light, a heat lamp, or other appliance for a limited period of time before it is automatically turned off. This device is apparently too expensive for general use since it has not been adapted for solving the problem at hand. Furthermore, it is noisy and, because it operates mechanically, has a limited operating life.

SUMMARY OF THE INVENTION

In accordance with the invention claimed, an improved electrical switch is provided with a delayed turn-off function allowing a period of light following the turn-off operation during which the user may find his way to his destination before darkness occurs.

It is, therefore, one object of this invention to provide an improved electrical switch with a turn-off delay function.

Another object of this invention is to provide such a switch employing a solid-state electronic network which is connected in parallel with a conventional mechanical light switch, the electronic network affording a current path during the delay period.

A further object of this invention is to provide an improved switch in which the operating current of a lamp or other controlled appliance flows through the conventional switch when in the ON position avoiding the energization of the electronic network during that time and therefore dissipating no energy in the control circuit during the normal operation of the lamp or other appliance.

A still further object of this invention is to provide such an improved switch in which the current passed by the electronic control network after the termination of a delay period is extremely low thereby dissipating very little electrical power in the circuit during this condition.

A still further object of this invention is to provide such an improved switch in which the electronic network incorporates very small electronic components which may be compactly assembled on a miniature printed circuit board.

A still further object of this invention is to provide such an improved switch which, by virtue of its low power dissipation and its compact form, may be installed in the standard wall switch box either as a complete assembly including the mechanical switch and the parallel electronic network or as a separate electronic network to be connected across an existing and already installed switch.

A still further object of this invention is to provide such an improved switch in which the parallel electronic network is inherently self-protecting against damage by voltage surges or transients commonly encountered on utility power lines.

A still further object of this invention is to provide such an improved switch in a form which utilizes no moving mechanical part aside from the mechanical switch itself and which is thus capable of a long operating life.

Yet another object of this invention is to provide such an improved switch which is inherently so low in cost that it will attract a large market and find wide use in homes throughout the world.

Further objects and advantages of the present invention will become apparent as the following description proceeds and the features of novelty which characterize the invention will be pointed out with particularity in the claims annexed to and forming a part of this specification.

BRIEF DESCRIPTION OF THE DRAWING

The present invention may be more readily described by reference to the accompanying drawing in which:

FIG. 6 is an illustration of the operating waveforms of the second embodiment shown in FIGS. 2 and 4;

FIG. 7 is an illustration of the operating waveforms of the third embodiment shown in FIG. 3;

FIG. 8 is a simplified schematic diagram of a lighting circuit incorporating a fourth embodiment of the invention; and FIG. 9 is a simplified schematic diagram of a lighting circuit incorporating a fifth embodiment of the invention.

DESCRIPTION OF THE PREFERRED EMBODIMENT

Figure 1:
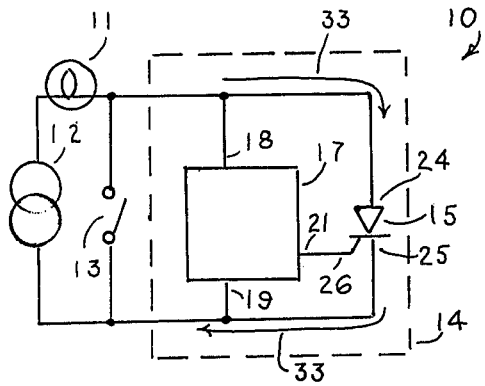
FIG. 1 is a simplified schematic diagram of a first embodiment of the delayed turn-off switch of the invention.

Referring more particularly to the drawing by characters of reference, FIG. 1 discloses an electric lighting circuit 10 incorporating a first embodiment of the invention employing an incandescent lamp 11, a source of alternating current voltage 12, and an ordinary mechanical ON/OFF switch 13 connected in parallel with an electronic network 14.

The electronic network 14 comprises a silicon controlled rectifier 15 and a solid-state electronic control circuit 17. The control circuit 17 has a positive input terminal 18, a negative terminal 19 and an output terminal 21. The controlled rectifier 15 comprises an anode 24, a cathode 25 and a gate 26 and blocks current flow when a negative anode-to-cathode voltage is applied. If a positive anode-to-cathode voltage is applied, it also blocks current flow until a positive gate-to-cathode signal is momentarily applied. The positive signal triggers the controlled rectifier to a conductive state which persists so long as the positive anode-to-cathode voltage or current is sustained. Once the anode-to-cathode current terminates, the controlled-rectifier reverts to its "off" state or blocking condition.

The control circuit 17 is energized by a positive voltage applied to terminal 18 with respect to terminal 19, and it responds within a few milliseconds following the application of the positive voltage by delivering a positive voltage pulse at its output terminal 21.

In FIG. 1 the controlled rectifier 15 is connected in parallel with switch 13, its anode 24 being connected to one side of the switch 13 and its cathode 25 being connected to the other. The control circuit 17 is connected in parallel with controlled rectifier 15 with positive input terminal 18 of circuit 17 connected to anode 24 of controlled rectifier 15 and with negative terminal 19 of circuit 17 connected to cathode 25 of controlled rectifier 15. Output terminal 21 of network 17 is connected to gate 26 of controlled rectifier 15.

Figure 5:
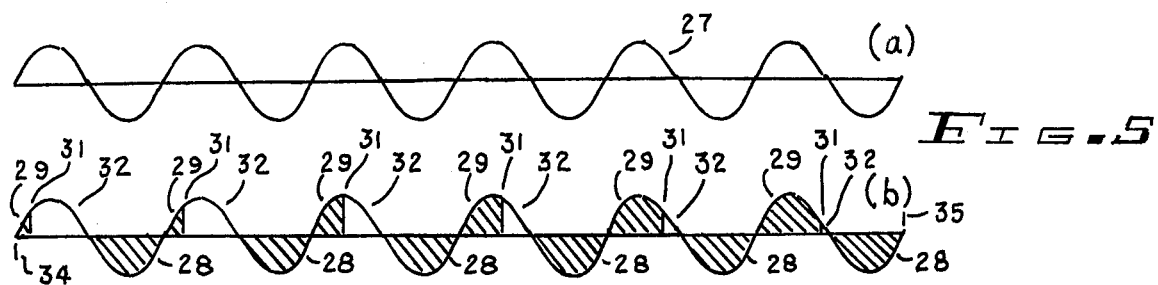
FIG. 5 is an illustration of the operating waveforms of the first embodiment shown in FIG. 1.

The operation of network 14 of FIG. 1 is most readily described with reference to its operating waveforms as shown in FIGS. 5(a) and 5(b). FIG. 5(a) shows the sinusoidal alternating current voltage waveform 27 delivered by source 12, typically at 50 or 60 cycles per second. FIG. 5(b) illustrates the manner in which the network 14 controls the passage of current through the lamp 11 for a period of time following the opening of switch 13.

In FIG. 5(b) current to the lamp 11 is blocked for all portions of the sinusoidal waveform that are shown cancelled by oblique cross-hatch lines. During the negative half-cycles 28 current is blocked by virtue of the reverse blocking characteristics of the controlled rectifier 15.

During the initial portion 29 of each positive half cycle, also shown cancelled by oblique cross-hatch lines, controlled rectifier 15 blocks current flow by virtue of its initial forward blocking characteristic. At a time 31 in each positive half-cycle the control circuit 17 delivers a positive voltage pulse via its output terminal 21 to gate 26 of controlled rectifier 15, thereby switching controlled rectifier 15 to its conducting or ON condition. Controlled rectifier 15 then passes current during the remaining portion 32 of the positive half cycle which has not been cancelled by oblique cross-hatch lines. During the portion 32 of each positive half cycle a current 33 flows from source 12 through lamp 11, anode 24 to cathode 25 of controlled rectifier 15 and back to source 12.

The waveform of FIG. 5(b) covers a time period beginning at a time 34 immediately following the opening of the switch 13. It will be noted that for each successive positive half cycle the time 31 occurs at a relatively later time in the half cycle so that the conduction interval 32 covers a progressively smaller portion of the half cycle and the average value of the current 33 is proportionately reduced. Finally, at some later time 35 the portion 32 is reduced substantially to zero with the turn-on time 31 occurring at the end of the positive half cycle. In the waveform of FIG. 5(b) only a few cycles are shown between times 34 and 35; in an actual implementation of the invention this period of time is considerably longer, typically a minute or more, the actual period of time being controlled by the value of a capacitor incorporated in control circuit 17.

Figure 2:
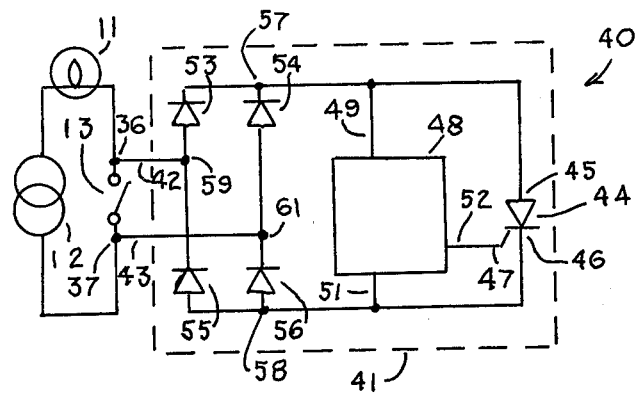
FIG. 2 is a simplified schematic diagram of a second embodiment of the delayed turn-off switch of the invention.

In a second lighting circuit 40, incorporating a second embodiment of the invention as shown in FIG. 2, an electronic network 41 has its input leads 42 and 43 connected across the terminals 36 and 37 of the switch 13 which is again serially connected with the source 12 and the lamp 11.

The network 41 comprises a controlled rectifier 44 with an anode 45, a cathode 46 and a gate 47; a control circuit 48 identical or similar to control circuit 17 of the electric lighting circuit 10 and having input terminals 49 and 51 and output terminal 52. Four rectifier diodes 53, 54, 55 and 56 are connected in a full-wave, single-phase bridge configuration in which the cathodes of diodes 53 and 54 are connected together to form a positive bridge terminal 57. The anodes of diodes 55 and 56 are connected together to form a negative bridge terminal 58 with the cathode of diode 55 being connected to the anode of diode 53 to form a first a-c terminal 59. The cathode of diode 56 is connected to the anode of diode 54 to form a second a-c terminal 61.

The first input lead 42 of network 41 is connected to a-c terminal 59 and the second input lead 43 is connected to a-c terminal 61. Positive bridge terminal 57 and terminal 49 of circuit 48 are connected to anode 45 of controlled rectifier 44 while negative bridge terminal 58 is connected to terminal 51 of network 48 and to cathode 46 of controlled rectifier 44. Output terminal 52 of network 48 is connected to gate 47 of controlled rectifier 44.

The operation of the circuit illustrated in FIG. 2 is most readily described with reference to the waveforms shown in FIGS. 6(a) and 6(b). Again the network 41 provides a current path in parallel with switch 13 for a limited period of time after switch 13 is opened. The effect of the bridge rectifier comprising diodes 53, 54, 55 and 56 is to permit the controlled-rectifier 44 to be conductive during the negative as well as the positive half cycles of the voltage source 12. This is accomplished through the function of diodes 53, 54, 55 and 56 which convert the a-c voltage shown in FIG. 5(a) to the fullwave rectified voltage shown in FIG. 6(a) which is impressed across the controlled rectifier 44. The control circuit 48 turns on controlled rectifier 44 at some point in each half cycle during the limited period of time following the opening of switch 13, thereby allowing a continued period of light following the opening of switch 13. Wave form 62 of FIG. 6(b) illustrates the effect of the turning-on of controlled rectifier 44 during each half cycle in this period. Again each half cycle is divided into a first interval 63 during which the controlled rectifier 44 is in a forward blocking state and a second interval 64 during which the controlled rectifier is conducting following its turn-on at time 65.

As shown in FIG. 6(b), the turn on time 65 circuits early in the half cycle immediately following the opening of switch 13 at a time 66 and it occurs progressively later in each successsive half cycle until a time 67 when it occurs at the end of the half cycle or not at all. Simultaneously, the period 64 during which current flows in lamp 11 is gradually reduced from a relatively long period at time 66 to zero at time 67. Again in a typical implementation, the period between the times 66 and 67 would approximate a minute or more.

Current flow during the conduction intervals 64 during the positive half cycle is from source 12 through lamp 11, diode 53, controlled rectifier 44, diode 56 and back to source 12. During the negative half cycle of source 12, current flow is from source 12 through diode 54, controlled rectifier 44, diode 55, lamp 11 and back to source 12.

Control circuit 48 operates identically to the operation of circuit 17 of FIG. 1 except in the case of network 41 circuit 48 turns the controlled rectifier 44 on during both positive and negative half cycles of the source 12. The apparent difference to the user of the network 41 is that light intensity drops almost imperceptibly immediately following the opening of switch 13 while it drops approximately 50 percent the instant switch 13 is opened if network 14 is employed. The 50 percent drop associated with network 14 occurs because controlled rectifier 15 of network 14 passes current during the positive half cycle only.

Figure 3:
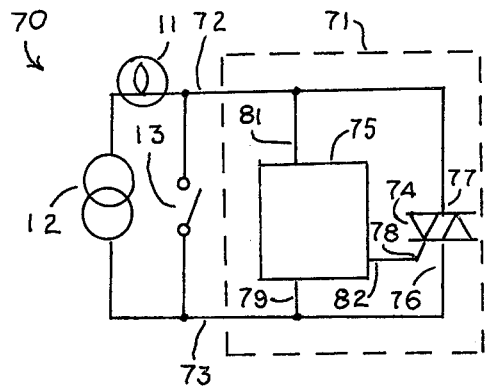
FIG. 3 is a simplified schematic diagram of a third embodiment of the delayed turn-off switch of the invention.

In a third electric lighting circuit 70, as shown in FIG. 3, an electronic network 71 has its input leads 72 and 73 connected across the terminals of switch 13 which is again serially connected with source 12 and lamp 11.

The network 71 comprises a triac 74 and a control circuit 75. The triac 74 has a first main terminal 76, a second main terminal 77 and a gate terminal 78. Control circuit 75 has a first input terminal 79, a second input terminal 81 and an output terminal 82. The first main terminal 76 of triac 74 and the first input terminal 79 of control circuit 75 are connected to input lead 73 while the second main terminal 77 of triac 74 and the second input terminal 81 of control circuit 75 are connected to input lead 72 of the network 71. Output terminal 82 of control circuit 75 is connected to gate 78 of triac 74.

Triac 74 is a semi-conductor device similar to a controlled rectifier except that it has a capability for controlled current conduction in either direction whereas the controlled rectifier can conduct current in only one direction. Thus, when either a positive or a negative half cycle of voltage is applied across a triac the triac blocks voltage until a gate signal, either positive or negative, is applied to the gate of the triac whereupon the triac is triggered to a conductive state which is sustained until the current is reduced to zero. The triac then returns to the blocking state.

The control circuit 75 of FIG. 3 is similar to the control circuit 17 and 48 of FIGS. 1 and 2, respectively, but with appropriate variations to accommodate the a-c voltage impressed across its terminals 81 and 79.

The waveform of FIG. 7 illustrates the operation of embodiment 70 of FIG. 3. Time 83 of FIG. 7 again corresponds to the instant of the opening of switch 13. At the initiation of each half cycle of the alternating current voltage supplied by source 12, the triac 74 is non-conductive and it blocks current flow throughout the period 84 until it is triggered to a conductive state at time 85. It then conducts current during the remaining period 86 of the half cycle. Again, the control circuit 75 causes the period 86 to approach a full half cycle at time 83 and to be reduced substantially to zero at some later time 87.

The circuit 70 of FIG. 3 is thus functionally equivalent to the embodiment 40 of FIG. 2 in terms of its control of the current through lamp 11 during the period of time following the opening of switch 13.

FIG. 4 again shows circuit 40 of FIG. 2 but with a detailed illustration of control circuit 48.

Figure 4:
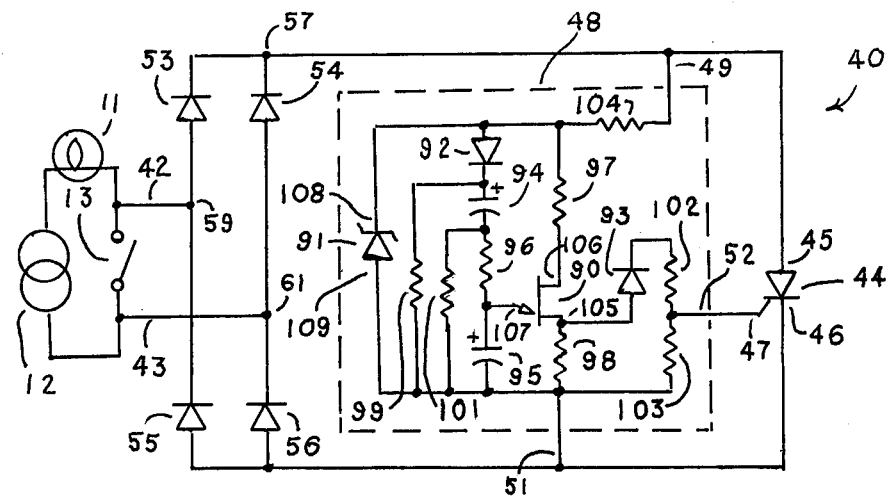
FIG. 4 is a complete schematic diagram of the second embodiment of FIG. 2 showing details of the electronic control circuit.

As shown in FIG. 4 the control circuit 48 comprises a unijunction transistor 90, a zener diode 91, rectifier diodes 92 and 93, capacitors 94 and 95 and resistors 96, 97, 98, 99, 101, 102, 103 and 104.

Resistor 104 and zener diode 91 provide a regulated voltage of approximately 24 volts to the balance of control circuit 48, the resistor 104 limiting current through diode 91 following its breakover at its zener level.

Unijunction transistor 90, capacitor 95 and resistors 96, 97, and 98 are connected as a relaxation oscillator which is commonly employed as a gate trigger circuit for controlled rectifiers.

Unijunction transistor 90 has a first base 105, a second base 106 and an emitter 107. As suggested by the arrow representing the emitter 107, positive current conduction occurs from emitter 107 to base 105. In the presence of a positive voltage applied to base 106 relative to base 105, however, an internal voltage divider effect prevents current flow from emitter 107 to base 105 unless the emitter voltage exceeds the voltage divider potential which is commonly known as the peak point voltage which is typically one-half to three-fourths of the value of the voltage applied to base 106 relative to base 105. Once the peak point voltage is exceeded the apparent impedance between emitter 107 and base 105 switches rapidly to a very low value. A more detailed explanation of the characteristics of the unijunction transistor and its connection and operation in a relaxation oscillator circuit is given in the General Electric Company SCR Manual, Fifth Edition as published in 1972 by the Semiconductor Products Department, Syracuse, New York, pages 98-104.

In a typical relaxation oscillator the first base of the unijunction transistor is connected through a base resistor to a negative potential, the second base is connected through a base resistor to a positive potential and the emitter is connected to the junction between two serially-connected timing elements including a resistor and a capacitor with the free end of the capacitor connected to the negative potential and the free end of the resistor connected to the positive potential.

In control circuit 48 a voltage source of approximately 24 volts is developed across zener diode 91, the positive potential appearing at its cathode 108 and the negative potential at its anode 109. Base 105 of unijunction transistor 90 is connected to anode 109 of diode 91 through base resistor 98, and base 106 is connected to cathode 108 of diode 91 through base resistor 97. Emitter 107 is connected to the junction of serially-connected timing capacitor 95 and timing resistor 96, the free end of capacitor 95 being connected to the negative potential at anode 109 of diode 91. The free end of resistor 96 is connected to the positive potential at cathode 108 of diode 91 through capacitor 94 and diode 92. Diode 92 is polarized to pass current from the positive potential through the series network including capacitor 94, resistor 96 and capacitor 95 but to block current flow in the opposite direction.

At the initiation of each half cycle of voltage delivered by source 12 a voltage is developed across diode 91 and is impressed across the unijunction oscillator circuit as just described. Capacitor 95 is charged by a current flowing from cathode 108 of diode 91 through diode 92, capacitor 94, resistor 96 and capacitor 95, to anode 109 of diode 91. When the charge on capacitor 95 reaches the peak point voltage of transistor 90, the internal junction between emitter 107 and base 105 breaks down and capacitor 95 discharges rapidly through emitter 107, base 105 and resistor 98 developing a positive voltage pulse across resistor 98. Because base 105 is connected through serially connected diode 93 and resistor 102 to gate 47 of controlled rectifier 44, the positive pulse is coupled through diode 93 and resistor 102 to gate 47 and it triggers controlled-rectifier 44 to the conductive state. This occurs at time 65 shown in FIG. 6(b).

With each such charging cycle of timing capacitor 95 a small charge is built up in capacitor 94 which is a much larger capacitor in terms of microfarad rating than capacitor 95 and a larger and larger charge accumulates in capacitor 94 as succeeding half cycles of operation occur. As the charge builds up in capacitor 94, the effective or net voltage available to charge timing capacitor 95 is diminished and the peak point voltage is consequently developed across capacitor 95 at a later point in each successive half cycle so that the trigger pulse occurs at a correspondingly later point as indicated by the waveform shown in FIG. 6(b).

If the peak voltage is not reached before the end of the half cycle the residual charge on capacitor 95 is discharged by the firing of transistor 90 as the source voltage goes to zero. Diode 92 prevents the discharge of capacitor 94 through resistor 104 while controlled rectifier 44 is conductive. Resistor 99 is connected from the positive plate of capacitor 94 to the anode 109 of diode 91 and resistor 101 is connected from the negative plate of capacitor 94 to anode 109. These resistors provide a discharge path for capacitor 94 when switch 13 is closed, thereby allowing capacitor 94 to be reset for another cycle of operation of network 41. Connection of the two resistors 99 and 101 as indicated is preferred to the connection of a single resistor in parallel with capacitor 94 because such a parallel resistor would pass current into the timing capacitor 95.

Resistor 103 is connected between gate 47 and cathode 46 of controlled rectifier 44 to reduce the sensitivity of controlled rectifier 44 and prevent its erratic triggering. If a less sensitive controlled rectifier is employed, resistor 103 may not be required. Diode 93 accomplishes a related function by affording a threshhold against noise signals appearing at base 105 of transistor 90. Resistor 102 limits current delivered to gate 47 during the discharge of capacitor 95.

In a variation of the control circuit 48 with appropriate semiconductor parameters, resistors 99, 101, 97, 102 and 103 and diode 93 may be omitted and a discharge resistor connected in parallel with capacitor 94.

Three different by functionally similar variations of the invention have been illustrated and described, each of which involves the connection of an electronic network in parallel with a mechanical switch, the network providing a current path in parallel with the switch for a limited period of time following the opening of the switch. A controlled rectifier has been used in two configurations and a triac has been employed in another as the parallel current-carrying element. Other devices including power transistors could be employed in the same role with appropriate modifications of the control circuit. A pair of controlled rectifiers in a reverse parallel connection could also be employed.

In the foregoing preferred embodiments of the invention a solid state delay network has been connected in parallel with a mechanical switch. In every case the mechanical switch carries the current during the normal operation of the light and the delay network carries the current for the limited period of time following the opening of the mechanical switch.

FIGS. 8 and 9 illustrate further variations of the invention in which the main mechanical switch is eliminated, the delay networks carrying the current both during normal operation and during the delay period.

FIG. 8 illustrates a lighting circuit 110 in which a delay network 111 has its input terminals 112 and 113 connected in series with an electric light 11 and a source of alternating current voltage 12. The delay network 111 is similar to the delay network 41 of FIG. 2, including the controlled rectifier 44, the same control circuit 48 and the same bridge rectifier comprising the four diodes 53, 54, 55, 56. Again, the positive bridge terminal 57 is connected to control circuit terminal 49 of control circuit 48 and to anode 45 of controlled rectifier 44. Negative bridge terminal 58 is connected to control circuit terminal 51 and to cathode 46 of controlled rectifier 44. The output terminal 52 of control circuit 48 is connected to gate 47 of controlled rectifier 44. In addition, however, network 111 includes a resistor 114 and a single-pole single-throw switch 115 serially connected between anode 45 and gate 47 of controlled rectifier 44. In the circuit of FIG. 8 the switch 115 serves as the on/off switch for the light 12. When switch 115 is closed gate current flows through resistor 114 to turn on controlled rectifier 44 which carries the current for light 11 during the normal operating period. When switch 114 is opened the delay network 111 functions as explained earlier providing a current path for the energization of the light 11 during the delay period.

FIG. 9 illustrates a lighting circuit 116 in which a delayed turn-off switching network 117 has its input terminals 118 and 119 serially connected with electric light 11 and the source of alternating current voltage 12. The delay network 117 is similar to delay network 71 shown in FIG. 3, incorporating the triac 74 and the control circuit 75 connected as shown in FIG. 3. In addition, however, network 117 has a resistor 121 and a single-pole, single-throw, switch 122 serially connected between main terminal 77 and gate terminal 78 of the triac 74. When switch 122 is closed gate current is supplied through resistor 121 to gate 78 early in each half cycle of source 12 triggering triac 74 to the conductive state so that triac 74 carries the normal operating current of light 11. When switch 122 is opened, the control circuit 75 becomes operative and the delay network 117 functions in the same manner as network 71 of FIG. 3 to provide a current path during the delay period.

In accordance with the objects of the invention an improved light switch is provided with a turn-off delay comprising a very few small and inexpensive solid-state components. In the preferred embodiments of FIGS. 1–4 the power dissipated by the components is essentially zero at all times except during the delay period when it is also negligible and of limited duration so that the complete switch assembly may be mounted in the standard switch box normally employed for the ordinary mechanical light switch. The entire control circuit with the exception of the two capacitors may be produced for volume production as an integrated circuit and the cost and size of the switch may in this manner be reduced still further. When controlled rectifiers or triacs are employed as the current-carrying elements during the delay period, the switch become self-protecting against voltage surges, during the delay and "off" periods because of the characteristics of these devices which simply turn on when their forward voltage rating is exceeded. The energy of the voltage surge is then dissipated harmlessly in the serially-connected lamp.

Because of this feature and because no moving mechanical parts are employed beyond the mechanical on/off switch itself, the life of the improved switch is indefinitely long.

Although but a few embodiments of the invention have been illustrated and described, it will be apparent to those skilled in the art that various other changes and modifications may be made without departing from the spirit of the invention or from the scope of the appended claims.

What is claimed is:

1. A two-terminal delay network for connection across a mechanical switch comprising:
    a switching element having first and second power electrodes and a gate electrode,
    a phase-delay to zero conduction control circuit having first and second control input terminals and an output terminal,
    first and second delay network terminals,
    said first delay network terminal being connected to said first power electrode and to said first control input terminal,
    said second delay network terminal being connected to said second power electrode and to said second control input terminal,
    said output terminal being connected to said gate electrode,
    means for directly connecting said first delay network input terminal to a first terminal of the mechanical switch, and
    means for directly connecting said second delay network input terminal to a second terminal of the mechanical switch,
    whereby the mechanical switch, while it is closed, carries the load current to a light or other load and upon the opening of the mechanical switch said control circuit supplies turn-on signals to said gate electrode during each cycle of alternating current voltage supplied to a light or other load controlled by the mechanical switch causing said switching element to be conductive and to carry current to the light or other load for a limited period of time following the opening of the mechanical switch.

2. The delay network set forth in claim 1 in further combination with:
    a light switch having first and second switch terminals,
    said first terminal of said delay network being connected to said first switch terminal,
    said second terminal of said delay network being connected to said second switch terminal, and
    means for connecting said first and second switch terminals in series circuit relationship with an electric load.

3. The delay network set forth in claim 1 wherein:
    said switching element is a solid-state semiconductor, and
    said control circuit is a solid-state electronic control circuit.

4. The delay network set forth in claim 3 in further combination with:
    a mechanical switch having first and second switch terminals,
    said first terminal of said delay network being connected to said first switch terminal,
    said second terminal of said delay network being connected to said second switch terminal, and
    means for connecting said first and second switch terminals in series circuit relationship with an electric light or other load.

5. The delay network set forth in claim 3 wherein:
    said solid-state semiconductor switching element is a controlled rectifier having an anode as said first power electrode, a cathode as said second power electrode, and a gate as said gate electrode.

6. The delay network set forth in claim 5 in further combination with:
    a mechanical switch having first and second switch terminals,
    said first terminal of said delay network being connected to said first switch terminal,
    said second terminal of said delay network being connected to said second switch terminal, and
    means for connecting said first and second switch terminals in series circuit relationship with an electric light or other load.

7. The delay network set forth in claim 3 wherein:
    said solid-state semiconductor switching element is a triac having a first main terminal as said first power electrode, a second main terminal as said second power electrode, and a gate as said gate electrode.

8. The delay network set forth in claim 7 in further combination with:
    a mechanical switch having first and second switch terminals,
    said first terminal of said delay network being connected to said first switch terminal,
    said second terminal of said delay network being connected to said second switch terminal, and
    means for connecting said first and second switch terminals in series circuit relationship with an electric light or other load.

9. A two-terminal turn-off delay network for connection across an ordinary mechanical light switch comprising:
    a solid-state semiconductor switching element having first and second power electrodes and a gate electrode,
    first, second, third and fourth solid-state rectifier diodes each having an anode and a cathode, said rectifier diodes being connected in a conventional single phase full-wave bridge configuration, said cathodes of said first and said second diodes being connected together to form a positive bridge terminal, said anodes of said third and said fourth diodes being connected together to form a negative bridge terminal, said anode of said first diode and said cathode of said third diode being connected together to form a first a-c bridge terminal, and said anode of said second diode and said cathode of said fourth diode being connected together to form a second a-c bridge terminal,
    means for directly connecting said first a-c bridge terminal to a first terminal of said light switch, and
    means for directly connecting said second a-c bridge terminal to a second terminal of said light switch,
    a solid state phase-delay to zero conduction electronic control circuit having first and second input terminals and an output terminal,
    said first input terminal of said solid-state phase-delay electronic control circuit being connected to said first power electrode and to said negative bridge terminal,
    said second input terminal of said solid-state phase-delay to zero conduction electronic control circuit being connected to said second power electrode and to said negative bridge terminal, and said solid-state phase-delay to zero conduction electronic control circuit output terminal being connected to said gate electrode, whereby the mechanical switch, while it is closed, carries the load current to a light or other load and upon the opening of the mechanical switch said solid-state phase-delay electronic control circuit supplies turn-on signals to said gate electrode during each half cycle of alternating current voltage supplied to the light or other load causing said solid-state electronic switching element to be conductive for a limited period of time following the opening of the light switch.

10. The turn-off delay network set forth in claim 9 in further combination with:

a mechanical switch having first and second switch terminals, said first a-c bridge terminal being connected to said first switch terminal, said second a-c bridge terminal being connected to said second switch terminal, and provision for connection of said first and second switch terminals in series circuit relationship with an electric light or other load across an alternating current source of voltage.

11. The turn-off delay network set forth in claim 9 wherein:

said solid-state semiconductor switching element comprises a power transistor having a collector as said first power electrode, an emitter as said second power electrode, and a base as said gate electrode.

12. The turn-off delay network set forth in claim 11 in further combination with:

a mechanical switch having first and second switch terminals, said first a-c bridge terminal being connected to said first switch terminal, said second a-c bridge terminal being connected to said second switch terminal, and provision for connection of said first and second switch terminals in series circuit relationship with an electric light or other load across an alternating current source of voltage.

13. The turn-off delay network set forth in claim 9 wherein:

said solid-state semi-conductor switching element is a controlled rectifier having an anode as said first power electrode, a cathode as said second power electrode, and a gate as said gate electrode.

14. The turn-off delay network set forth in claim 13 in further combination with:

a mechanical switch having first and second switch terminals, said first a-c bridge terminal being connected to said first switch terminal, and said second a-c bridge terminal being connected to said second switch terminal and provision for connection of said first and second switch terminals in series circuit relationship with an electric light or other load across an alternating current source of voltage.

15. The turn-off delay network set forth in claim 13 wherein:

said solid-state electronic control circuit comprises:

a unijunction transistor having a first base terminal, a second base terminal and an emitter, a zener diode having an anode and a cathode, a semiconductor rectifier diode having an anode and a cathode, first and second capacitors each having a positive plate and a negative plate, said first capacitor having a relatively large microfarad rating and said second capacitor having a relatively small microfarad rating, first, second, third and fourth resistors, a first end of said first resistor being connected to said first control circuit input terminal, the second end of said first resistor being connected to said cathode of said zener diode, to said anode of said semiconductor rectifier diode and to said second base of said unijunction transistor, said cathode of said semiconductor rectifier diode being connected to said positive plate of said first capacitor and to a first end of said second resistor, the second end of said resistor being connected to said negative plate of said first capacitor and to a first end of said third resistor, the second end of said third resistor being connected to said emitter of said unijunction transistor and to said positive plate of said second capacitor, said first base of said unijunction transistor being connected to said control circuit output terminal and to a first end of said fourth resistor, and said anode of said zener diode, said negative plate of said second capacitor, and the second end of said fourth resistor being connected to said second input terminal of said solid-state electronic control circuit.

16. The turn-off delay network set forth in claim 15 in further combination with:

a light switch having first and second switch terminals, said first a-c bridge terminal being connected to said first switch terminal, said second a-c bridge terminal being connected to said second switch terminal, and means for connecting said first and second switch terminals in series circuit relationship with an electric light or other load across an alternating current source of voltage.

17. A delayed turn-off switching network comprising:

first, second, third and fourth rectifier diodes each having an anode and a cathode, a phase delay to zero conduction control circuit having first and second input terminals and an output terminal, a solid-state switching element having a first power electrode, a second power electrode and a gate electrode, first and second switching network terminals, a resistor, a single-pole, single-throw switch having first and second switch terminals, said cathodes of said first and second diodes being connected to said first input terminal of said control circuit, to a first end of said resistor and to said first power electrode of said solid-state switching element, said anodes of said third and fourth diodes being connected to said second input terminal of said control circuit and to said second power electrode of said solid-state switching element, said output terminal of said control circuit being connected to said gate electrode of said solid-state switching element, said second end of said resisitor being connected to said first switch terminal, said second switch terminal being connected to said gate electrode of said solid-state switching element, said anode of said first diode and said cathode of said third diode being connected together to form said first switching network terminal, said anode of said second diode being connected to said cathode of said fourth diode to form said second switching network terminal, means for connecting said first and second switching network terminals in series circuit relationship with a source of alternating current voltage and an electric light or other load, said controlled rectifier carrying current for said electric light or other load while said switch is closed, said control circuit supplying turn-on signals to said gate electrode of said solid-state switching element each half cycle to cause said controlled rectifier to carry current and to energize said light or other load for a limited period of time following the opening of said switch.

18. A delayed turn-off switching network comprising:

first and second switching network terminals, a phase delay to zero conduction control circuit having first and second control circuit input terminals and a control circuit output terminal, a triac having first and second main terminals and a gate terminal, a resistor, a single-pole, single-throw switch having first and second switch terminals, said first control circuit input terminal being connected to a first end of said resistor and to said first main terminal of said triac to form said first switching network terminal, said second control circuit input terminal being connected to said second main terminal of said triac to form said second switching network terminal, the second end of said resistor being connected to said first switch terminal, said second switch terminal and said control circuit output terminal being connected to said gate terminal, means for connecting said first and second switching network terminals in series circuit relationship with an alternating current voltage source and an electric light or other load, said triac carrying current for the light or other load while said switch is closed and during a limited period of time following the opening of said switch, said control circuit supplying gate signals to said triac during said limited period of time following the opening of said switch.

* * * * *

UNITED STATES PATENT OFFICE
CERTIFICATE OF CORRECTION

Patent No. 4,082,961   Dated  April 4, 1978

Inventor(s)  Luther L. Genuit

It is certified that error appears in the above-identified patent and that said Letters Patent are hereby corrected as shown below:

Claim 15, line 24, after "said" add ---second---.

Signed and Sealed this

Fifteenth Day of August 1978

[SEAL]

Attest:

RUTH C. MASON
*Attesting Officer*

DONALD W. BANNER
*Commissioner of Patents and Trademarks*